United States Patent [19]
Ferber

[11] Patent Number: 5,567,037
[45] Date of Patent: Oct. 22, 1996

[54] LED FOR INTERFACING AND CONNECTING TO CONDUCTIVE SUBSTRATES

[75] Inventor: Andrew R. Ferber, New York, N.Y.

[73] Assignee: Ferber Technologies, L.L.C., Roseland, N.J.

[21] Appl. No.: 434,370

[22] Filed: May 3, 1995

[51] Int. Cl.$^6$ .................................................. F21L 15/08
[52] U.S. Cl. ...................... 362/104; 362/249; 362/800; 362/806; 63/1.1; 24/101 R; 2/905
[58] Field of Search ................................. 362/103, 104, 362/249, 800, 806; 2/243.1, 905; 313/512, 110; 63/1.1, 2, 26, 32; 24/101 R, 102 P, 102 A

[56] References Cited

U.S. PATENT DOCUMENTS

| | | | |
|---|---|---|---|
| 3,609,475 | 9/1971 | Kaposhilin | 317/234 R |
| 3,812,406 | 5/1974 | Henri | 317/235 N |
| 4,047,075 | 9/1977 | Schoberl | 313/500 |
| 4,774,642 | 9/1988 | Janko et al. | 362/103 |
| 4,942,744 | 7/1990 | Wei | 63/1.1 |
| 5,018,053 | 5/1991 | Belknap et al. | 362/104 |
| 5,066,889 | 11/1991 | Edwards | 313/512 |
| 5,113,325 | 5/1992 | Eisenbraun | 362/103 |
| 5,140,220 | 8/1992 | Hasegawa | 362/800 |
| 5,160,200 | 11/1992 | Cheselske | 362/249 |
| 5,253,149 | 10/1993 | Ostema et al. | 362/104 |
| 5,278,734 | 1/1994 | Ferber | 362/103 |
| 5,296,782 | 3/1994 | Sawai | 313/499 |
| 5,440,461 | 8/1995 | Nadel et al. | 362/103 |

Primary Examiner—Denise L. Gromada
Assistant Examiner—Sara Sachie Raab
Attorney, Agent, or Firm—Lerner, David, Littenberg, Krumholz & Mentlik

[57] ABSTRACT

An illumination device for enhancing the structural and aesthetic appearance of associated articles or substrates and to provide operative coaction with conductive current paths made from conductive paints, inks and the like compositions on such articles and substrates is disclosed. The illumination device comprises an LED having leads, the LED and at least one portion of the leads are encapsulated within a substantially nonconductive relatively transparent or translucent housing. At least a second portion of the leads of the LED extend outside of the housing and are arranged substantially flush along an exterior surface of the housing so that when the housing is connected by suitable connectors to the associated article or substrate, electrical communication with an external power source can be established for operating and actuating the LED.

19 Claims, 5 Drawing Sheets

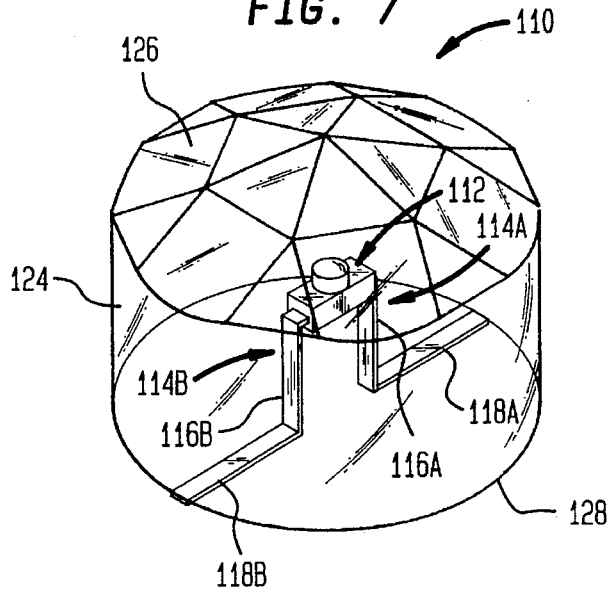
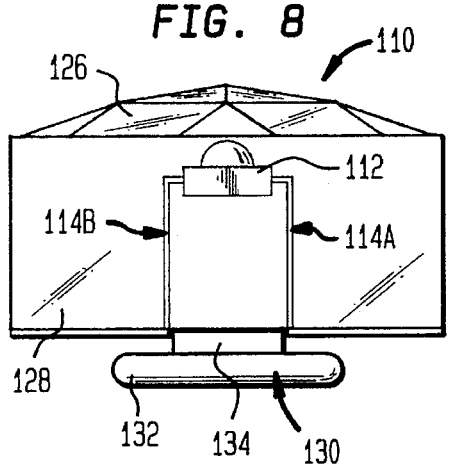
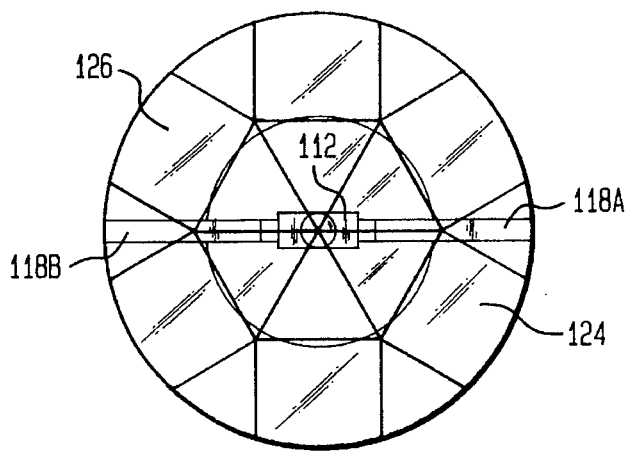
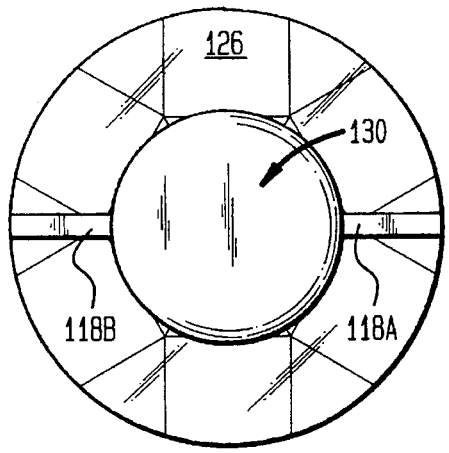
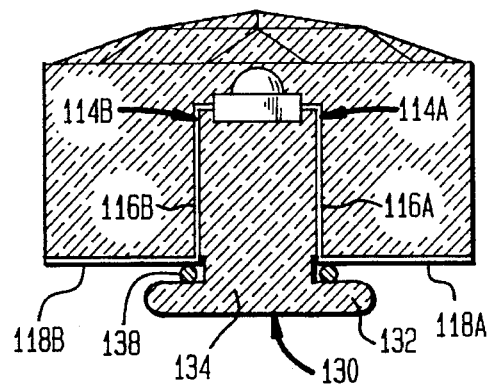

LED FOR INTERFACING AND CONNECTING TO CONDUCTIVE SUBSTRATES

FIELD OF THE INVENTION

The present invention relates to light emitting diodes (LEDs). More particularly, the present invention relates to LED modules disposed for providing illuminated decorations, designs or assemblies on apparel such as wearing apparel, decorative apparel, toys, clothing for dolls or accessories and operatively associated with conductive paints, inks and the like type of compositions on such articles for transmitting electrical current for the operation and actuation of such LED modules.

BACKGROUND OF THE INVENTION

The use of LED modules for decorating various articles, such as wearing apparel or accessories, is well known in the apparel industry. Such LED modules are also connected to many types of articles, the structure of the LED modules and the means for connecting the LED modules to an associated article varies depending upon the structure of the article to which the LED modules are affixed and the means for conducting the current for operating and actuating such LED modules.

Although the prior art discloses LED modules that are connected to various types of articles such as clothing, footwear, sunglasses, etc. and to electrical circuitry thereon generally utilizing hard wire conductors for operating and actuating the LED modules, there is no teaching or suggestion as to how to affix LED modules to electrically conductive paths, such as conductive paint, arranged on the associated apparel, footwear, toys, etc.

U.S. Pat. No. 5,278,734 discloses a creative structure which utilizes cooperating threads to attach LED modules to various articles including wearing apparel such as sweatshirts and the like.

The prior art also discloses encapsulated LEDs for various purposes. For example, U.S. Pat. No. 5,018,053 discloses a partially encapsulated LED within a non-conductive enamel-like material for use as jewelry. U.S. Pat. No. 3,812,406 discloses a crystal on which a large number of electroluminescent diodes are manufactured to display an alphanumeric letter. The crystal is made of a semi-conductor material and is protected by a transparent resin.

None of the aforementioned patents disclose an LED encapsulated within a housing made of non-conductive material wherein the leads of the LED extend outside of the housing and are bent or formed for placement substantially flush against the housing wall through which they extend. This arrangement is a significant improvement over known LED modules as it provides a structure suitable for electrical connection to conductive paint paths, and other electrically conductive paths, arranged on an associated article or substrate.

Further, there is a need in the prior art for providing an efficient arrangement for connecting an LED module to an associated article, such as clothing for humans or dolls or other accessories wherein the LED module can be affixed to the apparel in an aesthetically pleasing manner.

The term apparel as used in the present application is intended to encompass various types of articles including wearing apparel, decorative articles, footwear, clothing for dolls, accessories for dolls or other accessories on which an LED module may be affixed for decorative purposes.

The present invention solves all of these shortcomings in the prior art and particularly provides an improved LED module encapsulated within a housing and which is intended to be secured, affixed or adhered to various types of apparel to create a design on or enhance the appearance of apparel, or to toys, dolls and other devices.

SUMMARY AND OBJECTS OF THE INVENTION

According to one aspect of the present invention, an illumination device comprises an LED having a diode body and a pair of leads connected to the diode body. Each of the leads includes a first portion extending along a first plane away from the diode body. Encapsulating material is provided which forms a housing which completely surrounds the diode body and defines external walls having predetermined boundaries such that the first portion of the leads extends along the first plane and through at least one of the external walls formed by the encapsulating material. Each of the leads also includes a second portion which extends outside of the housing along a second plane generally transverse to the respective first portion of the leads so as to lie substantially flush against the external wall of the housing through which the first portion extends. The second portion of the leads preferably terminates at a location within the boundary defined by the external wall along which the respective second portion of the leads extends.

Preferably, the respective second portion of the leads begins at a location after the associated first portion of the leads exits the housing. In one preferred embodiment, the second portion of the leads extends substantially to the boundary of the external wall.

The encapsulating housing of the illumination device may comprise various shapes and sizes. In a preferred embodiment, the housing includes facets thereon which act to enclose the diode body of the LED within a jewel-like casing.

The illumination device may also comprise a connector means for affixing the housing to a given piece of apparel or other substrate. The connector means may comprise a coacting socket for removably engaging the housing with the apparel or other substrate to which the housing is being affixed. Alternatively, a suitable connector on the housing can extend through the apparel, toy, doll or other substrate or device. Any of the connector means for such illuminating device act to enable the leads on the illumination device to be brought into operative association with the conductive paints, inks or the like compositions on the apparel, toys, dolls and other devices for delivering the current for operating and actuating the encapsulated LED.

The apparel used in connection with the illumination device in accordance with the present invention may comprise wearing apparel, decorative articles, clothing for dolls, accessories for dolls and humans, etc. The apparel may include a first surface and a second surface and may have current conducting means arranged on the first surface for transmitting current from a power source to the associated LED module or modules as the case may be. In this embodiment, the second portion of the leads is arranged adjacent to the first surface of the apparel for electrical communication with the current conducting means. The socket may be arranged adjacent the second surface of the apparel in alignment with the housing so that it can be brought into engagement therewith.

The engagement between the socket and the housing may be enhanced by adhering or gluing the housing to the first surface of the apparel and alternately or selectively adhering or gluing the socket to the second surface of the apparel.

Where the connector means extends through the apparel, toy, doll or other substrate or device, a suitable removable and independent locking means can be provided for engaging and holding each respective LED module or modules in assembled position, as the case may be.

The present invention is also directed toward a decorative article of apparel in combination with the illumination device discussed above. Preferably, the decorative article of apparel includes current conducting path thereon for permitting current to flow from a power source to an associated LED module. The current conducting path may comprise conductive paint, ink or other conductive compositions.

It may be desirable for the decorative article to include a switch which controls the flow of current from the power source to the illumination device of the present invention. Various switches or the like devices may be used. Alternatively, a human finger, or other body part, may act as a switch when placed across a conductive path so that current is momentarily permitted to flow from the associated power source to the LED module or modules, thus permitting the associated or desired LED module or modules to be momentarily and selectively activated.

Other objects, features and advantages of the present invention will be more fully understood with reference to the following detailed description of the preferred embodiments when taken in conjunction with the accompanying drawings.

BRIEF DESCRIPTION OF THE DRAWINGS

FIG. 7 is a perspective view of a third embodiment of the illumination device in accordance with the present invention including another form of connecting assembly.

FIG. 8 is a side view of the illumination device shown in FIG. 7.

FIG. 9 is a top plan view of the illumination device shown in FIG. 7.

FIG. 10 is a bottom plan view of the illumination device shown in FIG. 7.

FIG. 11 is a cross-section taken on line 11—11 of FIG. 9, and

DETAILED DESCRIPTION OF THE PREFERRED EMBODIMENTS

Figure 1:
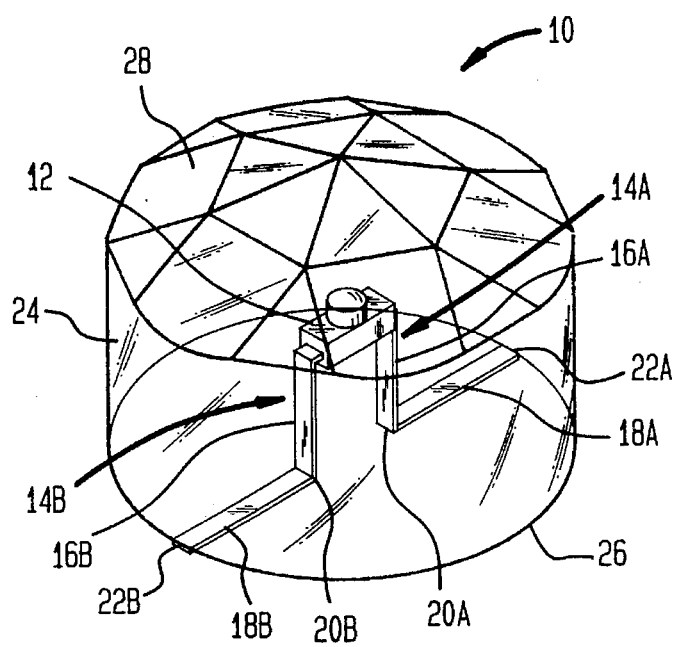
FIG. 1 is a perspective view of an illumination device in accordance with the present invention.
Figure 2:
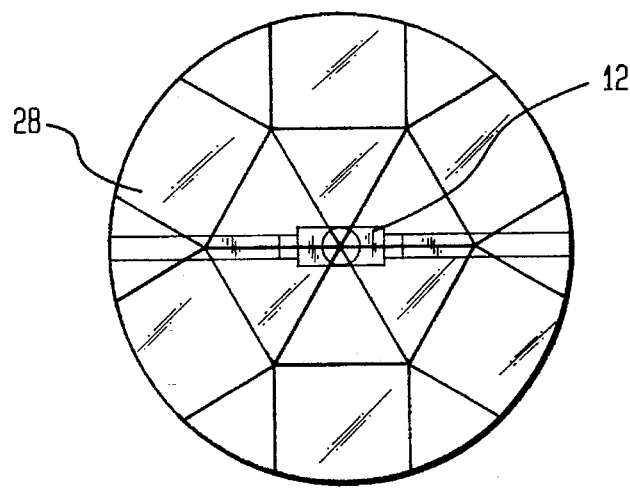
FIG. 2 is a top plan view of the illumination device shown in FIG. 1.
Figure 3:
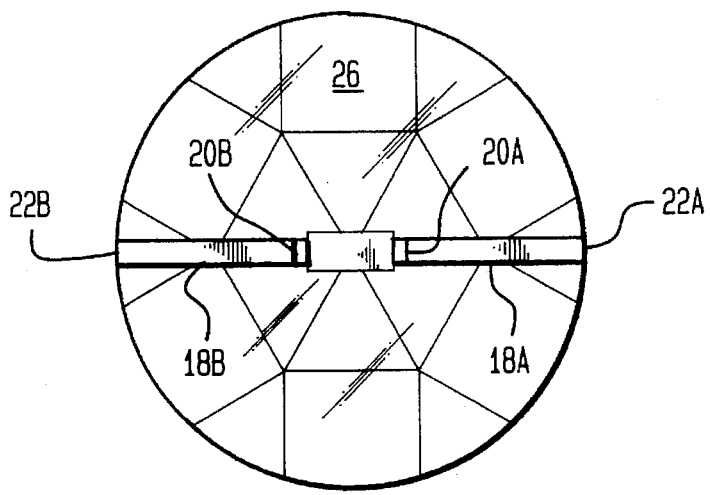
FIG. 3 is a bottom plan view of the illumination device shown in FIG. 1.

In accordance with one embodiment of the invention, FIGS. 1, 2 and 3 show an illumination device generally designated 10. The illumination device 10 includes an internally arranged diode forming an LED 12 having a pair of conductive leads 14A and 14B.

Each of the leads 14A and 14B include a first vertically or longitudinally extending portion 16A and 16B. The leads 14A and 14B also include a second portion 18A and 18B which extend generally transverse or even substantially perpendicular to the vertically extending portions 16A and 16B, all of which is shown in FIG. 1 of the drawings.

The LED body 12 and a portion of the leads 14A and 14B are encapsulated within a housing 24, preferably made of a non-conductive relatively transparent or translucent material. Suitable materials for this purpose are well known in the art. Those skilled in the art will recognize that the particular material used to form the housing 24 which encapsulates the LED body 12 and the portion of the leads 14A and 14B is not critical. Thus, in addition to the materials above illustrated, housing 24 may be made of many different types of materials that can provide a supporting structure and may be formed, molded, cast and fabricated to provide a desired aesthetically pleasing appearance.

Preferably, the encapsulating housing material is sufficiently transparent or translucent to allow light on operation of the LED 12 to be transmitted therethrough. The housing 24 includes a bottom surface 26, which may be substantially flat. This arrangement will permit sufficient contact to result between the second portion 18A and 18B of the leads 14A and 14B and the associated conductive paint paths or other materials used to form electrically conductive paths.

As further illustrated in FIGS. 1 and 2, the housing 24 also includes a top section 28 which may have a pleasing ornamental design including facets thereon. The facets may appear similar to facets which are often cut into gem stones or cosmetic jewelry. This aspect of the present invention will provide the illumination device 10 with a creative aesthetic appearance when it is used to decorate an associated article.

Referring further to FIGS. 1 and 3, the respective second portions 18A and 18B of the leads 14A and 14B extend substantially flush along the external side of the bottom surface 26 of housing 24. Although the bottom surface 26 is illustrated in FIGS. 1 and 3 as being substantially flat, it may have alternate shapes without departing from the scope of the present invention. However, regardless of the shape of the bottom surface 26, it is important that the respective second portion 18A and 18B of the leads 14A and 14B extend along the external side of the bottom surface 26 to establish the necessary electrical communication between the leads 14A and 14B to achieve the desired operation and activation of the LED 12 in the illumination device in accordance with the present invention.

Figure 4:
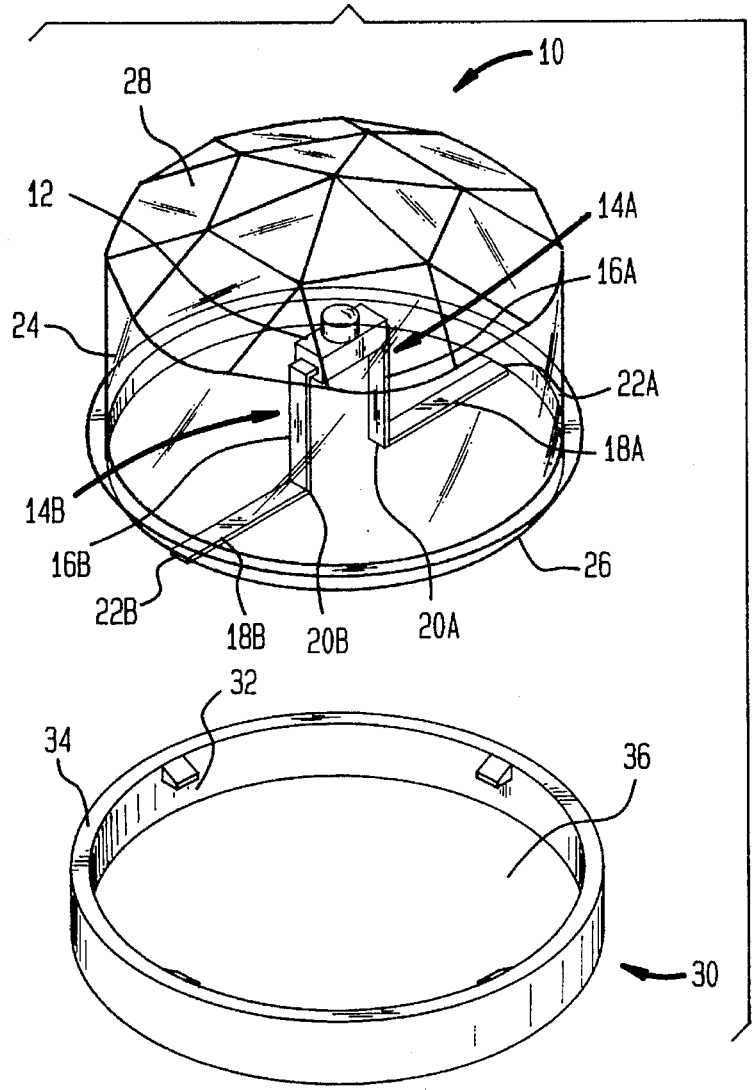
FIG. 4 is an exploded perspective view of a second embodiment of an illumination device in accordance with the present invention including one form of connecting assembly.

A transitional connecting portion 20A and 20B of the leads 14A and 14B as shown in FIGS. 1, 3 and 4 exists between the first portion 16A and 16B and the second portion 18A and 18B at the point where leads 14A and 14B emerge from the encapsulating material which forms housing 24.

Figure 6:
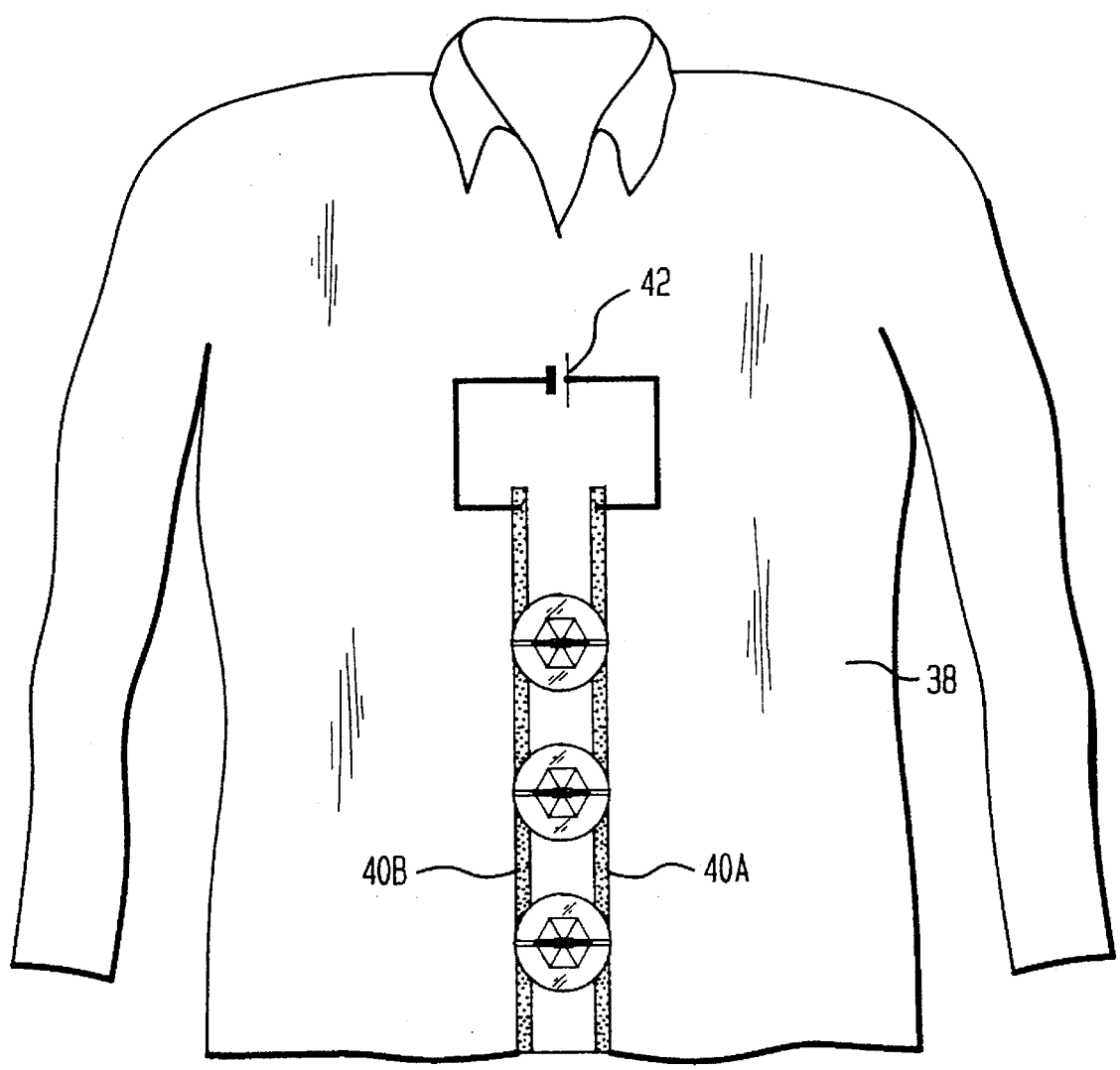
FIG. 6 is a perspective view of the illumination device of FIGS. 1 or 4 shown in assembled position on an article of wearing apparel.

In a preferred embodiment, the second portion of the leads 18A and 18B terminates at a location designated 22A and 22B substantially adjacent to the outermost or peripheral boundary of the bottom surface 26. This aspect of the present invention is best shown in FIG. 3. In alternate embodiments, the second portion 18A and 18B of the leads 14A and 14B may not extend to the peripheral boundary defined by the bottom surface 26. However, it is important that a sufficient length of the respective second portion 18A and 18B of the leads 14A and 14B extend along the bottom surface 26 so that electrical contact can be made with electrically conductive paths arranged on an article or substrate such as an article of apparel, as shown in FIG. 6.

FIG. 4 illustrates a second embodiment of the present invention wherein the illumination device 10' includes a sockets-type connector generally designated 30 that may be used to facilitate connecting the illumination device 10' to the surface of an article, such as clothing for people or dolls or accessories therefor.

Socket 30 is preferably made of a nonconductive material which will minimize the risk of shorting the illumination device 10 when it is in electrical communication with the desired current conducting paints, inks and the like compositions defining the current conducting paths for operating the LED 12 encapsulated in the housing 24. In this regard, the socket 30 is preferably made of a plastic material or other material that is compatible with the housing 4. However, if desired, the socket 30 may also be made of a conductive material provided that the article to be arranged between the socket 30 and the second portion 18A and 18B of the leads 14A and 14B does not permit current to flow therebetween.

Figure 5:
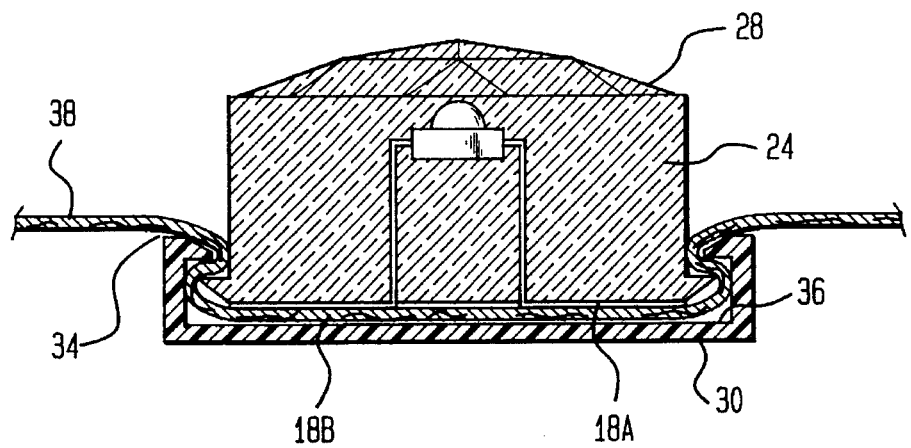
FIG. 5 is a cross-sectional view of the illumination device shown in FIG. 4 in assembled position on an article of apparel.

As best illustrated in FIGS. 4 and 5, the socket 30 includes a recessed area 32 designed to receive the housing 24. The recessed area 32 may be sized to accommodate a press fit engagement with the side walls of the housing 24. A shoulder 34 is arranged along the boundary of the socket 30 to clearly define the recessed area 32. Optionally, the socket 30 may include a bottom surface 36. However, in alternate embodiments, the bottom surface 36 may be eliminated and the socket 30 may merely comprise an annular ring. In such embodiments, the annular ring is preferably sized and shaped to accommodate a frictional engagement to the housing 24 and the article on which the illumination device 10 is mounted.

In the embodiment shown in FIGS. 4 and 5, the shoulder 34 protrudes further toward the center of the recessed area 32 than do the side walls of the socket 30. This is another optional feature of the present invention which is designed to accommodate a lip 24A arranged on the housing 24 adjacent the bottom surface 26. In assembled position, the lip 24A on the housing 24 may extend beneath the protruding shoulder 34 to assure that the illumination device 10 is securely affixed in assembled position as shown in FIG. 5.

FIG. 5 further shows that inwardly extending lugs 32A can be provided on the wall of the recess 32 for operative association with the lip 24A to prevent separation of the housing 24 from the socket 30 when in assembled position on the apparel or other article.

In operation, the illumination device 10 is used to enhance the decorative appearance of an article such as wearing apparel or accessories for toy dolls. The encapsulating housing material 24 may be designed in the shape of a jewel, or it may have a less ornate appearance. In either case, it is preferable for the housing material 24 to be relatively transparent or translucent so that light from the LED 12 can be transmitted therethrough.

The illumination device 10 or 10' is particularly suited to be secured to an article having conductive paths thereon.

The conductive paths may include conductive paints, inks or the like compositions such as the first and second conductive paint paths 40A and 40B shown on a sweatshirt 38 in FIG. 6. As can be appreciated with reference to FIGS. 5 and 6, the substantially flush arrangement of the second portion 18A and 18B of the leads 14A and 14B with respect to the bottom surface 26 of the housing 24 will facilitate electrical connection between conductive paint paths 40A and 40B and the second portion 18A and 18B of the leads. Further, the outermost ends 22A and 22B of the second portion 18A and 18B of the leads are shown in FIG. 6 as being in electrical contact with corresponding first and second conductive paint paths 40A and 40B. In order to enhance the ornamental appearance of the present invention, and to prevent structural defects, it is preferable that the outermost ends 22A and 22B of the second portion 18A and 18B of the leads 14A and 14B are terminated within the boundaries defined by the bottom surface 26 of the housing 24.

The use of conductive paint paths 40A and 40B in combination with LEDs is a novel concept which has many different practical uses. For purposes of the present invention, it is not necessary to consider the current conducting capabilities of various types of conductive paints, inks and the like compositions. However, it should be appreciated that suitable examples of conductive paints include compositions or paints which permit sufficient current to flow therethrough so that the illumination device 10 can be selectively activated. The conductive paints may include different colors and may have a composition that can be washed along with an associated article without causing degradation of the current carrying capability thereof.

A [If] further detailed description of conductive compositions that may be used in connection with the present invention [, there are] is describe [more fully] in U.S. Pat. No. 5,455,749 [co-pending application U.S. application Ser. No. 08/229, 359 filed Apr. 15, 1994], the disclosure of which is incorporated by reference herein.

A power source designated by battery 42 is shown in FIG. 6 as being associated with the sweatshirt 38. It may be preferable to place the power source 42 in a pocket or on the inner surface of an article of apparel to make the outer appearance of the apparel or article as attractive as possible. In order to prevent light from being continuously transmitted from the LED 12, the present invention may utilize various types of LEDs or switches to control when current from the battery source 42 will be transmitted along the conductive paint, inks or other compositions defining the current conductive paths 40A and 40B and ultimately to associated LED or LEDs 12.

A human finger, or other body part, may be sufficient to activate the illumination device 10 of the present invention. As such, the placement of a human finger across both of the conductive paint paths 40A and 40B at the same time may act as a switch so that current is permitted to momentarily flow to the associated LED within the housing 24 so that light can be transmitted from the LED 12. When the present invention is used in this manner, an open circuit condition will exist between the battery source 42 and the conductive paint, inks or other composition paths 40A and 40B. The act of placing a human finger across the conductive paths 40A and 40B will thus serve as an additional conductive path so that current from the battery source 42 will be permitted to flow through a circuit formed by conductive path 40A, lead 14A, LED 12, lead 14B and conductive path 40B.

In order to facilitate securing of the illumination device 10 on an article of apparel, such as the sweatshirt 38, it may desirable to use an external connecting means, such as the socket 30 illustrated in FIGS. 4 and 5. In this regard, the associated article of apparel, such as the sweatshirt 38, should be sufficiently flexible so that it can be press-fitted along with the housing 24 within the recessed area 32 of socket 30. The socket 30 may be designed to securely affix the housing 24 in assembled position on an article of apparel due to frictional forces. Alternatively, an adhesive composition can be used to secure the bottom surface 26 to an article of apparel in such a manner that the second portion of the leads 18A and 18B are arranged in proper position in conjunction with the first and second conductive paint, ink or other composition paths 40A and 40B so that electrical communication can be achieved. An adhesive composition can also be used in conjunction with the socket 30 to assure that the illumination device 10 is secured in a particularly stable manner on an associated article. In this regard, an adhesive composition may be placed between the bottom surface 26 and the surface of an article of apparel so that a bond is obtained therebetween. The socket 30 may then be press-fitted onto both the article of apparel and the housing 24 so that the bottom surface 26 extends beneath the shoulders 34. Still further, the bottom surface 36 of the socket 30 may be glued to the opposing side of an article of apparel, such as sweatshirt 38. When the bottom surface 26 is adhesively bonded to the opposite surface of the sweatshirt 38 in such a manner, the second portion of the leads 18A and 18B should be arranged in electrical contact with the conductive paint paths 40A and 40B.

FIGS. 7 to 12 of the drawings show a still further embodiment of an illumination device generally designated 110 in accordance with the present invention. Illumination device 110 differs from the embodiments of the present invention as above described because it illustrates another means for releasably connecting the illumination device into assembled position on an article of apparel, toys, dolls and other substrates and devices to provide operative connection with the conductive paint, ink or other composition current conducting paths on such apparel, toys, dolls and other substrates and devices.

Thus, illumination device 110 includes an internally disposed LED 112 having a pair of current conducting leads 114A and 114B. Leads 114A and 114B respectively include a first portion as at 116A and 116B extending generally vertically or along the longitudinal line of the illumination device 110. Continuous with the respective first portions 114A and 114B is a second portion as at 118A and 118B, generally transverse or perpendicular to the longitudinal lines of the respective first portions and disposed relative to each other, to extend preferably in opposite directions.

As in the above described embodiments, the LED 112 and the first portions 116A and 116B of the leads 114A and 114B are encapsulated within a housing generally designated 124 made from non-conductive preferably translucent or transparent material capable of supporting the LED 112 and capable of being formed, molded, cast or fabricated to provide both the alternative connecting means for connecting the illumination device 110 in assembled position on apparel, toys, dolls and other devices and to achieve where desirable an aesthetic appearance for the illumination device 110.

Thus, as in the form of the housing above described for illumination device 10 or 10' housing 124 includes a top section 126 and a bottom section 128 with a defined outer periphery.

The top section 126 may have an ornamental design including, for example, faceted surfaces to create a jewelry effect when the illumination device 110 is used for decoration purposes.

As in the earlier embodiments, the outer surface of bottom section 128 is shown as substantially flat with a defined outer border or periphery, it may have any desired shape so that when the housing 124 is connected or affixed in assembled position, the outer surface of the bottom section 128 will be disposed for operative contact with the outer surfaces of apparel, toys, dolls, and other substrates or devices on which the conductive paints, ink, or other compositions are applied. The leads 114A and 114B as in the earlier embodiments above described have the first portions 116A and 116B extending through the bottom section 126 to the outer surface and the second portions 118A and 118B continuous with the first portions of the leads lie generally flush with the outer surface of the bottom section 128 and extend from the point where the first portion of the leads exit onto the outer surface of the bottom section 128 preferably up to the outer periphery of the bottom section or at least a sufficient distance along the bottom section to enable the second portions to make electrical contact with the conductive paints, inks or other compositions providing the conductive paths for the current for operating and actuating the LED 112.

In this embodiment of the illumination device 110, housing 124 is further provided with a releasable connecting means as shown by a centrally disposed collarbutton shaped connecting member 130 projecting from the outer surface of the bottom section 128 along the longitudinal line of the housing in a direction generally opposite from the top section 126 of the housing 124. Collarbutton connecting member 130 includes a flange 132 and an elongated inner aspect 134 which is connected between the outer surface of the bottom section 128 and the flange 132 to hold the flange a predetermined distance from the bottom section 128.

Figure 12:
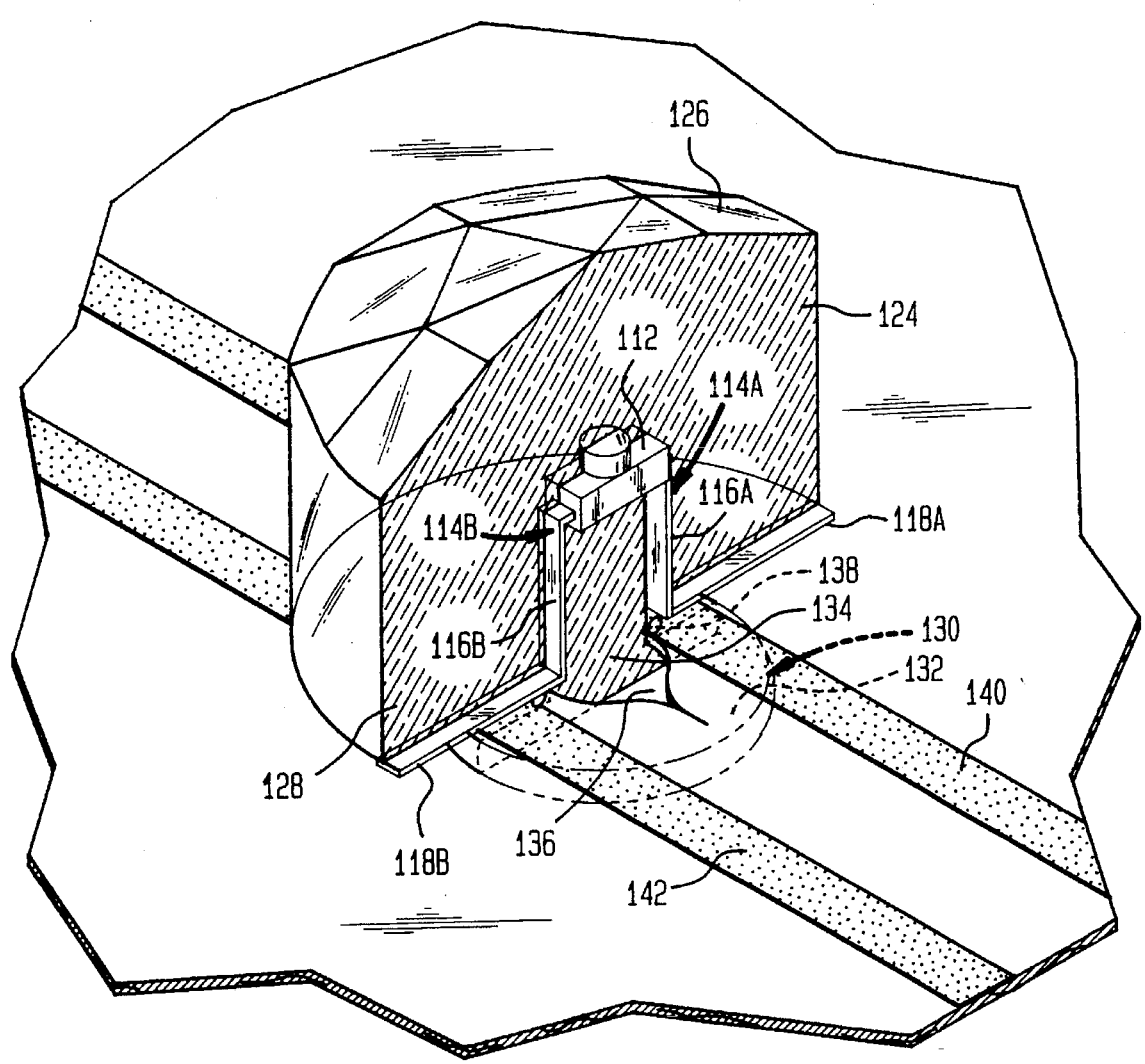
FIG. 12 is an enlarged perspective view partly in vertical section of the illumination device shown in FIGS. 7 to 11 of these drawings in assembled position on an article of apparel having the externally exposed second portion of the leads disposed in electrical communication with the conductive composition path on the apparel.

Collarbutton shaped connecting member 130 is adapted to fit through a suitable aperture 136 in the apparel, toy, doll or other substrate or device and, when so assembled, can receive a suitable resilient element such as an o-ring as at 138 about the elongated inner aspect 134 to hold the housing 124 and the illumination device 110 in assembled position on the apparel, toy, doll or other substrate or device to bring the second portions 118A and 118B into electrical communication with the conductive paint, inks or other compositions defining the conductive current paths as at 140 and 142, all of which is shown in FIG. 12 of the drawings.

In operation, at any suitable aperture 136 in an apparel, toy, doll or other substrate or device about which the conductive communication paths 140 and 142 have been established or applied, the collarbutton connecting member 130 for the housing 124 is inserted into aperture 136 until the second portions 118A and 118B of the leads 114A and 114B are in communication with the conductive current paths 140 and 142. The resilient element 138 is then affixed to the inner aspect 136 of the collarbutton connecting member 130 to releasably hold the housing in assembled position.

The switch or other means provided in the current conducting system as above described can now be used to operate and actuate the LED 112 of the illumination device 110.

Thus various embodiments of improved LED modules for use on and in connection with apparel, toys, dolls and other substrates or devices having conductive current paths made of conductive paints, inks or other compositions have been disclosed in accordance with the present invention.

While the foregoing description of the illustrated figures of the drawings are directed toward the preferred embodiments in accordance with the present invention, those skilled in the art will appreciate that numerous modifications can be made to various aspects of the present illumination device. Indeed, such modifications are encouraged by the description to be made in the materials, structure and arrangement of the disclosed embodiments without departing from the spirit and scope of the same. Thus, the foregoing description of the preferred embodiment should be taken by way of illustration rather than by way of limitation with respect to the present invention which is defined by the claims set forth below.

I claim:

1. An illumination device comprising:

An LED having a diode body and a pair of leads connected to maid diode body maid lead having a first portion extending along a first plane away from said diode body; encapsulating material forming a housing having external walls defining boundaries, said housing completely surrounding said diode body, said first portion of said leads extending along said first plane and being arranged within said housing, each of said leads having a second portion extending outside of said housing and being arranged substantially flush against one of said external walls of said housing and extending along a second plane substantially transverse to said first plane, said second portion of said leads terminating at a location within the boundary defined by said external wall along which said second portion of said leads extend and connector means for affixing said housing to a given piece of apparel, said connector means comprising a socket having means for engaging said housing and the apparel to which said housing is being affixed, said apparel having a first surface and a second surface and current conducting means arranged on said first surface for transmitting current from a power source to said LED, said second portion of said leads being arranged adjacent said first surface of said apparel for electrical communication with said current conducting means, said socket being arranged adjacent said second surface of said apparel in alignment with said housing and being in engagement therewith.

2. The illumination device of claim 1 wherein said housing includes a top section and a bottom section, said first plane extending along a longitudinal direction within said housing, said first portion of said leads extending from said diode body along said first plane and being disposed substantially entirely within said housing formed by said encapsulating material, said second portion of said leads beginning at a location substantially immediately after the first portion of said leads exit said housing.

3. The illumination device of claim 1 wherein said housing includes facets thereon to give the illumination device a jewel-like appearance.

4. The illumination device of claim 2 wherein said second portion of said leads extends substantially to the peripheral boundary of said external wall along which said leads extend.

5. The illumination device of claim 1 wherein the engagement between said socket and said housing is enhanced by gluing said housing to the first surface of said apparel and gluing said socket to the second surface of said apparel.

6. The illumination device of claim 1 wherein said connector means comprises, a projection having one end connected to the bottom section of the housing and a flange means at and end of the projection remote from the connected end, and means operatively and removably connectable to the projection to hold the illumination device in assembled position on the apparel to which said housing is being affixed.

7. The illumination device of claim 6 wherein the apparel has, an opening extending therethrough, a first surface and a second surface adjacent said opening, and current conducting means arranged on the first surface for transmitting current from a power source to said LED, said second portion of said leads arranged in assembled position adjacent said first surface of said apparel for electrical communication with said current conducting means, said projection disposed in assembled position for engagement with the opening in the apparel whereby the bottom section of the housing is disposed for contact with the current conducting means.

8. A decorative article of apparel having a first surface and a current conducting path arranged on the first surface comprising, an illumination device including, an LED having a diode body and a pair of leads connected to said diode body, a first portion of said leads extending along a first plane away from said diode body; encapsulating material forming a housing made of encapsulating material completely surrounding said diode body and having external walls defining boundaries, said first portion of said leads extending along said first plane arranged within said housing, each of said leads having a second portion extending outside of said housing and being arranged substantially flush against one of said external walls of said housing and along a second plane which extends substantially transverse to said first plane; and connector means for affixing said housing to said first surface of said apparel in a position where said second portion of said leads are arranged in electrical communication with said current conducting path.

9. The decorative article of claim 8 wherein said diode body includes a top side and a bottom side, said first plane extending through said top and bottom sides, said first portion of said leads extending from said bottom side along said first plane and being disposed substantially entirely within said housing formed by said encapsulating material, said second portion of said leads beginning at a location substantially immediately after said leads exit said housing.

10. The decorative article of claim 9 wherein said connector means comprises a socket having means for engaging said housing and said second surface of said decorative article of apparel.

11. The decorative article of claim 9 wherein said second portion of said leads extends substantially to the boundary of said external wall along which said leads extend.

12. The decorative article of claim 8 wherein said connector means comprises, a projection having one end connected to a bottom section of the housing and a flange means at the end of the projection remote from the connected end, and means operatively and removably connectable to the projection to hold the illumination device in assembled position on the apparel to which said housing is being affixed.

13. The decorative article of claim 8 having at least one opening extending therethrough and a first surface adjacent said opening, current conducting means arranged on the first surface for transmitting current from a power source to said LED, said second portion of said leads arranged in assembled position adjacent said first surface of said decorative article for electrical communication with said current conducting means, said projection disposed in assembled position for engagement with the opening in the apparel whereby a bottom section of the housing is disposed for contact with the current conducting means.

14. The decorative article of claim 8 wherein said housing includes facets thereon enclosing said diode body within a jewel-like casing.

15. The decorative article of claim 8 wherein said current conducting path comprises conductive paint.

16. The decorative article of claim 15 further comprising switch means for selectively permitting current to flow from said power source means to said illumination device.

17. The decorative article of claim 8 further comprising power source means for providing current to said current conducting path and said illumination device.

18. The decorative article of claim 8 wherein said second portion of said leads terminated at a location within the boundary defined by said external walls.

19. An illumination device comprising:

An LED having a diode body and a pair of leads connected to said diode body, said leads having a first portion extending along a first plane away from said diode body; encapsulating material forming a housing having external walls defining boundaries, said housing completely surrounding said diode body, said first portion of said leads extending along said first plane and being arranged within said housing, each of said leads having a second portion extending outside of said housing and being arranged substantially flush against one of said external walls of said housing and extending along a second plane substantially transverse to said first plane, said second portion of said leads terminating at allocation within the boundary defined by said external wall along which said second portion of said leads extend; and a projection having one end connected to a bottom section of the hosing and a flange at an end of the projection remote from the connected end, and means operatively and removably connectable to the projection to hold the illumination device in assembled position of the apparel to which said housing is being affixed.

\* \* \* \* \*

UNITED STATES PATENT AND TRADEMARK OFFICE
CERTIFICATE OF CORRECTION

PATENT NO. : 5,567,037
DATED : October 22, 1996
INVENTOR(S) : Ferber

It is certified that error appears in the above-indentified patent and that said Letters Patent is hereby corrected as shown below:

Column 5, line 14, "sockets-type" should read --socket-type--.

Column 5, line 25, "housing 4" should read --housing 24--.

Column 6, lines 33-38,

"A [If] further detailed description of conductive compositions that may be used in connection with the present invention is describe [more fully] in U.S. Pat. No. 5,455,749 [copending application U.S. application Ser. No. 08/229.359 filed Apr. 15, 1994], the disclosure of which is incorporated by reference herein." should read --A further detailed description of conductive compositions that may be used in connection with the present invention is described in U.S. Pat. No. 5,455,749, the disclosure of which is incorporated by reference herein.--

Column 9, line 15, "maid diode body maid lead" should read --said diode body, said lead --.

Column 9, line 29, "extend and" should read --extend; and--.

Column 11, line 10, "terminated" should read --terminate--.

UNITED STATES PATENT AND TRADEMARK OFFICE
CERTIFICATE OF CORRECTION

PATENT NO. : 5,567,037

DATED : October 22, 1996

INVENTOR(S) : Ferber

It is certified that error appears in the above-indentified patent and that said Letters Patent is hereby corrected as shown below:

Column 12, line 8, "allocation" should read -a location--.

Column 12, line 12, "hosing" should read --housing--.

Signed and Sealed this

Fourteenth Day of January, 1997

*Attest:*

BRUCE LEHMAN

*Attesting Officer*     *Commissioner of Patents and Trademarks*